(12) United States Patent
Kim et al.

(10) Patent No.: US 12,446,260 B2
(45) Date of Patent: Oct. 14, 2025

(54) THIN FILM TRANSISTOR AND DISPLAY APPARATUS COMPRISING THE SAME

(71) Applicant: LG Display Co., Ltd., Seoul (KR)

(72) Inventors: Sunggu Kim, Paju-si (KR); DaeHwan Kim, Paju-si (KR)

(73) Assignee: LG DISPLAY CO., LTD., Seoul (KR)

(\*) Notice: Subject to any disclaimer, the term of this patent is extended or adjusted under 35 U.S.C. 154(b) by 518 days.

(21) Appl. No.: 17/902,513

(22) Filed: Sep. 2, 2022

(65) Prior Publication Data
US 2023/0076003 A1    Mar. 9, 2023

(30) Foreign Application Priority Data

Sep. 3, 2021  (KR) .................. 10-2021-0117834
Jan. 1, 2022  (KR) .................. 10-2022-0000011

(51) Int. Cl.
| | |
|---|---|
| *H01L 27/32* | (2006.01) |
| *H01L 29/423* | (2006.01) |
| *H10D 30/67* | (2025.01) |
| *H10K 59/126* | (2023.01) |

(52) U.S. Cl.
CPC ....... *H10D 30/673* (2025.01); *H10D 30/6723* (2025.01); *H10D 30/6755* (2025.01); *H10K 59/126* (2023.02)

(58) Field of Classification Search
CPC .. H10D 30/673; H10D 30/67; H10D 30/6723; H10D 30/6755; H10D 86/423; H10D 86/40; H10D 86/60; H10K 59/126; H10K 59/121; H10K 59/351
See application file for complete search history.

(56) References Cited

U.S. PATENT DOCUMENTS

| | | | |
|---|---|---|---|
| 9,601,518 B2* | 3/2017 | Moon | H10D 86/60 |
| 10,056,442 B2* | 8/2018 | Li | H10K 59/126 |
| 12,245,487 B2* | 3/2025 | Kim | H10K 59/38 |
| 2013/0328043 A1 | 12/2013 | Lee | |
| 2016/0300859 A1* | 10/2016 | Moon | H10D 86/471 |
| 2017/0025488 A1* | 1/2017 | Li | H10K 59/126 |
| 2022/0399404 A1* | 12/2022 | Kim | H10K 59/126 |

FOREIGN PATENT DOCUMENTS

| | | |
|---|---|---|
| JP | 2015-195327 A | 11/2015 |
| KR | 10-2017-0045428 A | 4/2017 |

\* cited by examiner

*Primary Examiner* — Nikolay K Yushin
(74) *Attorney, Agent, or Firm* — Birch, Stewart, Kolasch & Birch, LLP

(57) ABSTRACT

A thin film transistor and a display apparatus including the thin film transistor are discussed. The thin film transistor can include a light shielding layer on at least a portion of a substrate, a buffer layer on the light shielding layer, an active layer on the buffer layer, a gate insulating layer on the active layer, and a gate electrode on the gate insulating layer. A gate electrode opening can be disposed in the gate electrode and is formed by removing a portion of the gate electrode.

20 Claims, 12 Drawing Sheets

THIN FILM TRANSISTOR AND DISPLAY APPARATUS COMPRISING THE SAME

CROSS-REFERENCE TO RELATED APPLICATIONS

This application claims priority to the Korean Patent Application No. 10-2021-0117834 filed on Sep. 3, 2021 in the Republic of Korea, and the Korean Patent Application No. 10-2022-0000011 filed on Jan. 1, 2022 in the Republic of Korea, the entire contents of all these applications being hereby expressly incorporated by reference into the present application.

BACKGROUND OF THE DISCLOSURE

Technical Field

The present disclosure relates to a thin film transistor and a display apparatus comprising the same.

Discussion of the Related Art

Since a thin film transistor (TFT) can be fabricated on a glass substrate or a plastic substrate, the thin film transistor is widely used as a switching device or a driving device of a display apparatus such as a liquid crystal display apparatus or an organic light emitting display apparatus.

According to a material constituting an active material, the thin film transistor can be divided into an amorphous silicon thin film transistor using an active layer of amorphous silicon, a polycrystalline silicon thin film transistor using an active layer of polycrystalline silicon, and an oxide semiconductor thin film transistor using an active layer of oxide semiconductor.

In this case, since the oxide semiconductor thin film transistor has high mobility and can have a large resistance change according to the content of oxygen, it can facilitate obtaining the desired physical properties. Further, since the oxide constituting the active layer can become a thin film at a relatively low temperature in the manufacturing process of the oxide semiconductor thin film transistor, a manufacturing cost can be low.

In addition, the oxide semiconductor is generally transparent owing to the properties of the oxide. As such, it is used often in a transparent display apparatus.

However, if external light is introduced into a rear surface of a lower direction of the thin film transistor, and then reflected on a gate electrode or a metal line, the oxide semiconductor can be deteriorated, whereby it can cause a limitation on the optical reliability of the thin film transistor.

In such cases, since the external light can generate reliability deterioration of the thin film transistor, a method capable of maximally blocking the external light from impinging on the thin film transistors of a display apparatus is desired so as to improve device reliability.

SUMMARY OF THE DISCLOSURE

The inventors of the present disclosure have recognized at least the above-mentioned limitations and other issues associated with the related art, and thus performed various experiments to address these issues in order to protect a thin film transistor from an external light source. Based on the results of these various experiments, the present disclosure provides a new thin film transistor capable of improving optical reliability and a display apparatus comprising such thin film transistors.

The present disclosure has been made to address these and other limitations associated with the related art, and it is an object of the present disclosure to provide a thin film transistor with improved optical reliability to external light, and a display apparatus comprising such thin film transistors.

In accordance with an aspect of the present disclosure, the above and other objects can be accomplished by the provision of a thin film transistor comprising a substrate, a light shielding layer on the substrate, a buffer layer on the light shielding layer, an active layer on the buffer layer, a gate insulating layer on the active layer, and a gate electrode on the gate insulating layer, wherein a gate electrode opening is provided in the gate electrode and is formed by removing a portion of the gate electrode.

According to an embodiment of the present disclosure, a thin film transistor can include a light shielding layer on a substrate, a buffer layer on the light shielding layer, an active layer on the buffer layer, a gate insulating layer on the active layer, and a gate electrode on the gate insulating layer, wherein the gate electrode includes a first gate electrode opening disposed within the gate electrode.

According to an embodiment of the present disclosure, a thin film transistor can include a light shielding layer extending in a first direction on a substrate, an active layer extending in the first direction on the light shielding layer, and a gate electrode extending in a second direction on the active layer. The second direction can be substantially perpendicular to the first direction, and the gate electrode can include at least one gate electrode opening extending in the first direction.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
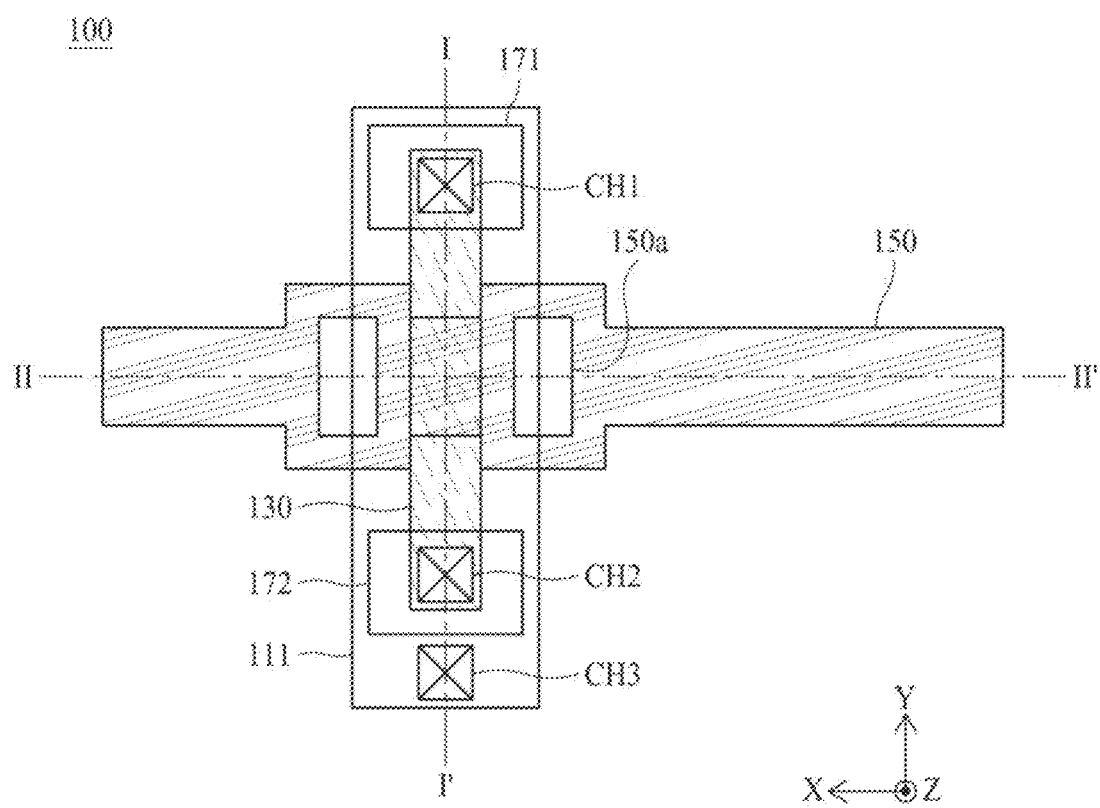
FIG. 1 is a plan view illustrating a thin film transistor according to one or more embodiments of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween can be included, unless "just" or "direct" is used.

If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another and may not define order. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Also, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Also, a source region can be a drain electrode, and a drain region can be a source electrode. Further, all components of each thin film transistor and each display apparatus according to all embodiments of the present disclosure are operatively coupled and configured.

Figure 2A:
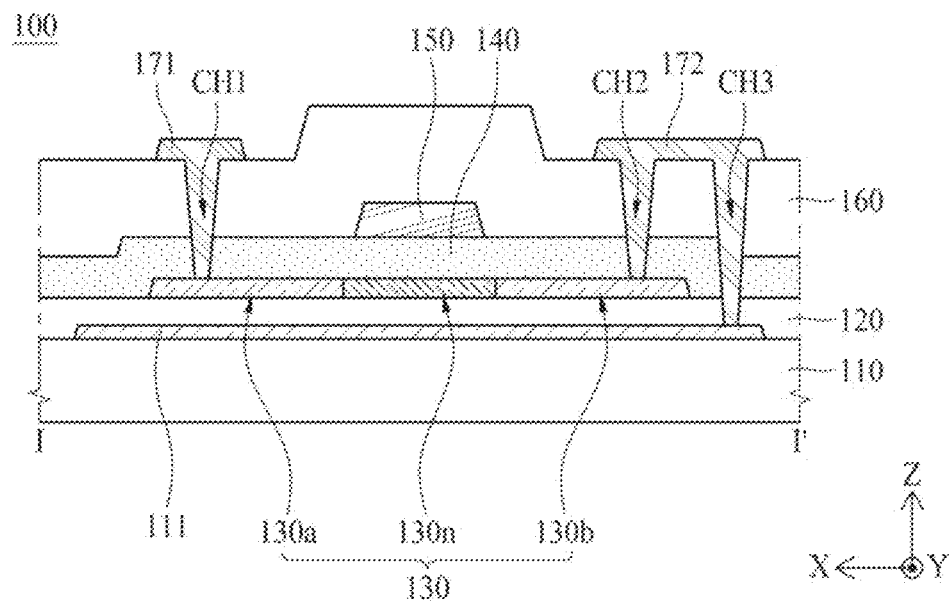
FIG. 2A is a cross sectional view along line I-I' of FIG. 1.
Figure 2B:
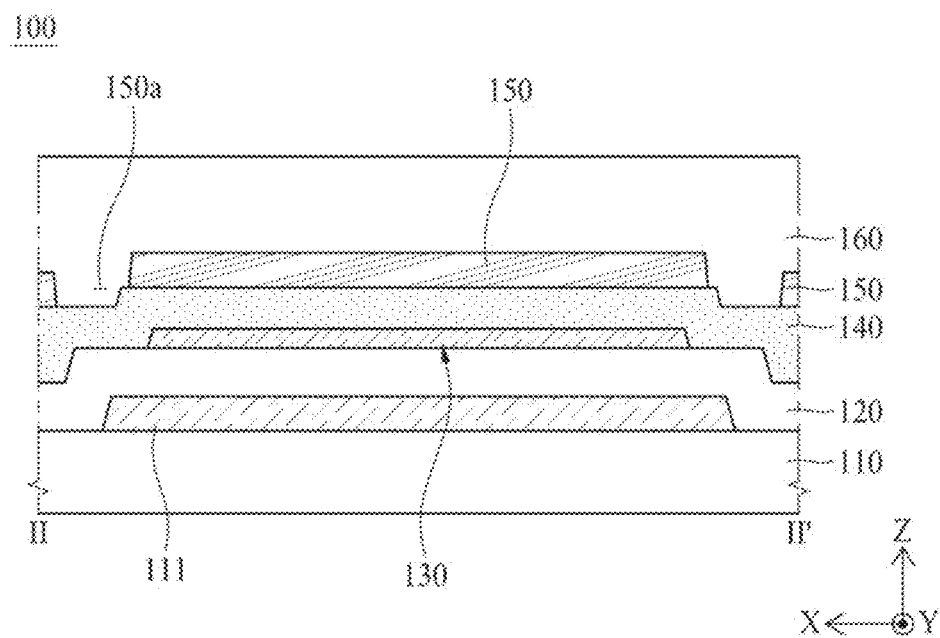
FIG. 2B is a cross sectional view along line II-II' of FIG. 1.

FIG. 1 is a plan view of a thin film transistor according to one or more embodiments of the present disclosure, FIG. 2A is a cross sectional view along line I-I' of FIG. 1, and FIG. 2B is a cross sectional view along line II-II' of FIG. 1.

Referring to FIGS. 1, 2A, and 2B, a thin film transistor 100 according to the embodiment of the present disclosure is disposed on a base substrate 110. The thin film transistor 100 can include a light shielding layer 111 on the base substrate 110, a buffer layer 120 on the light shielding layer 111, an active layer 130 on the buffer layer 120, a gate insulating film 140 on the active layer 130, a gate electrode 150 on the gate insulating film 140, and an interlayer insulating film 160 on the gate electrode 150.

The base substrate 110 can be formed of glass or plastic. If plastic is used for the base substrate 110, transparent plastic having flexibility, for example, polyimide can be used. If the base substrate 110 is formed of polyimide, heat resistant polyimide capable of enduring a high temperature can be used in consideration of a high temperature deposition process on the base substrate 110.

The light shielding layer 111 can be disposed on the base substrate 110. The light shielding layer 111 can be formed of a material having the light blocking characteristic or the light reflecting characteristic. The light shielding layer 111 blocks external light incident from the outside, to thereby protect the active layer 130 and the thin film transistor 100. Here, the light shielding layer 111 is not disposed on the entire surface of the base substrate 110, but can be disposed only on at least a portion overlapping the thin film transistor 100. For instance, in the examples of FIG. 1, the light shielding layer 111 extends along a direction that is perpendicular to the direction along which the gate electrode 150 extends. The light shielding layer 111 is disposed below the active layer 130 and the buffer layer 120, and overlaps with only a portion of the gate electrode 150, which will be discussed below in more detail.

The buffer layer 120 can be disposed on the base substrate 110 and the light shielding layer 111. The buffer layer 120 can include at least one of silicon oxide, silicon nitride, and metal-based oxide. The buffer layer 120 protects the active layer 130. Also, an upper surface of the base substrate 110 on which the light shielding layer 111 is disposed can be planarized by the buffer layer 120. Other components of the thin film transistor 100 including the active layer 130, which will be described later, can be disposed on the buffer layer 120.

The active layer 130 is disposed on the buffer layer 120.

According to one embodiment of the present disclosure, the active layer 130 can include a gallium-based oxide semiconductor material. The active layer 130 can include at least one of IGZO(InGaZnO)-based oxide semiconductor, GZO(GaZnO)-based oxide semiconductor, IGO(InGaO)-based oxide semiconductor, IGZTO(InGaZnSnO)-based oxide semiconductor, GZTO(GaZnSnO)-based oxide semiconductor, IZO(InZnO)-based oxide semiconductor, ITZO (InSnZnO)-based oxide semiconductor, FIZO(FeInZnO)-based oxide semiconductor, ZnO-based oxide semiconductor, and SIZO(SiInZnO)-based oxide semiconductor.

According to the embodiment of the present disclosure, the active layer 130 includes a channel portion 130n, a first connection portion 130a, and a second connection portion 130b. The first connection portion 130a contacts one side of the channel portion 130n, and the second connection portion 130b contacts the other side of the channel portion 130n.

The first connection portion 130a and the second connection portion 130b can be formed by selective conduction of the active layer 130. The first connection portion 130a and the second connection portion 130b are also referred to as conductor portions. According to the embodiment of the present disclosure, the first connection portion 130a of the active layer 130 becomes a source region, and the second connection portion 130b becomes a drain region. However, the embodiment of the present disclosure is not limited thereto, and the first connection portion 130a can be a drain region, and the second connection portion 130b can be a source region.

The gate insulating film 140 is disposed on the active layer 130. The gate insulating film 140 can be disposed to cover the active layer 130 and the buffer layer 120. The gate insulating film 140 can include at least one of silicon oxide, silicon nitride, and metal-based oxide. The gate insulating film 140 can have a single-layered structure or a multi-layered structure.

The gate electrode 150 is disposed on the gate insulating film 140. The gate electrode 150 overlaps the channel portion 130n of the active layer 130.

The gate electrode 150 can include at least one of aluminum-based metal materials such as aluminum Al or aluminum alloys, silver-based metal materials such as silver Ag or silver alloys, copper-based metal materials such as copper Cu or copper alloys, molybdenum-based metal materials such as molybdenum Mo or molybdenum alloys, chromium Cr, tantalum Ta, neodymium Nd, and titanium Ti. The gate electrode 150 can have a multi-layered structure including at least two conductive layers having the different physical properties.

The interlayer insulating film 160 can be disposed on the gate electrode 150, and can cover the gate insulating film 140. A first contact hole CH1 can be formed through portions of the gate insulating film 140 and the interlayer insulating film 160 on the gate insulating film 140. Similarly a second contact hole CH2 can be formed through other portions of the gate insulating film 140 and the interlayer insulating film 160, while a third contact hole CH3 can be formed through the gate insulating film 140, the interlayer insulating film 160 and the buffer layer 120, as shown in FIG. 2A.

The interlayer insulating film 160 can include a silicon oxide film SiOx or a silicon nitride film SiNx, and can protect the thin film transistor. In order to make the contact between the active layer 130 and a first electrode 171 and between the active layer 130 and a second electrode 172, the portion of the interlayer insulating film 160 corresponding to contact holes CH1 and CH2 can be removed to form the contact holes CH1 and CH2.

The thin film transistor 100 according to the embodiment of the present disclosure can include the first electrode 171 and the second electrode 172 disposed on the interlayer insulating film 160. For instance, the first electrode 171 can contact the first connection portion 130a via the first contact hole CH1, and the second electrode 172 can contact the second connection portion 130b via the second contract hole CH2. The first electrode 171 can serve as a source electrode, and the second electrode 172 can serve as a drain electrode. However, embodiments of the present disclosure are not limited thereto. For example, the first electrode 171 can serve as a drain electrode, and the second electrode 172 can serve as a source electrode. In addition, the first connection portion 130a and the second connection portion 130b can serve as a source electrode and a drain electrode, respectively, and the first electrode 171 and the second electrode 172 can serve as a connection electrode between the devices.

The first electrode 171 and the second electrode 172 can be electrically connected to (e.g., contacts) the active layer 130 through the contact holes CH1 and CH2, respectively. For instance, the first electrode 171 can be in contact with the first connection portion 130a through the first contact hole CH1. The second electrode 172 can be spaced apart from the first electrode 171 and can be in contact with the second connection portion 130b through the second contact hole CH2. Also, the second electrode 172 can contact the light shielding layer 111 through the third contact hole CH3.

Referring to FIG. 2B, the gate electrode 150 of the thin film transistor 100 according to the embodiment of the present disclosure can include at least one gate electrode opening 150a. The gate electrode opening 150a can overlap at least a portion of the light shielding layer 111 in a first direction (e.g., X direction), and the gate electrode opening 150*a* can be provided by removing an inclined portion or a stepped portion of the gate electrode 150. In a case where such inclined portion or the stepped portion of the gate electrode is not removed and thus no gate electrode opening is formed, then the inclined portion or the stepped portion can act as a main reflection path of an external light source such that the external light source can be introduced into the thin film transistor, which can degrade the electrical characteristics of the thin film transistor.

Accordingly, the gate electrode opening 150*a* is provided at the inclined portion or the stepped portion of the gate electrode 150 and is filled with the interlayer insulating film 160 in the present disclosure.

Referring to FIGS. 1 and 2B, a portion of the gate electrode opening 150*a* overlaps an end or an edge portion of the light shielding layer 111, while another portion (or remaining portion) of the same gate electrode opening 150*a* may not overlap with the light shielding layer 111. Also, the gate electrode opening 150*a* may not overlap the active layer 130.

The gate electrode 150 extends in the first direction, for example, a horizontal direction, and the active layer 130 and the light shielding layer 111 extend in a second direction, for example, a vertical direction perpendicular to the first direction. In this case, the gate electrode opening 150*a* can extend in the second direction. A width in a portion of the gate electrode 150 close to a region where the gate electrode opening 150*a* is formed can be greater than a width in the other portion of the gate electrode 150. For example, a width of the gate electrode 150 where the gate electrode opening 150*a* is provided is larger than another portion of the gate electrode 150 far from the gate electrode opening 150*a*.

The gate electrode opening 150*a* can be provided on one side and the other side of the light shielding layer 111, for example, left and right sides of the light shielding layer 111, respectively. Further, the gate electrode opening 150*a* can be provided on one side and the other side of the active layer 130, for example, left and right sides of the active layer 130, respectively. As such, in the gate electrode 150 of each thin film transistor, two gate electrode openings 150*a* can be provided on opposite sides of the active layer 130 and/or the light shielding layer 111.

The gate electrode opening 150*a* may not overlap the contact hole CH1 and CH2 for the connection between the active layer 130 and the first and second electrodes 171 and 172. Also, the gate electrode opening 150*a* may not overlap the first electrode 171 and the second electrode 172. Further, the gate electrode opening 150*a* may not overlap with the contact hole CH3 for connecting the light shielding layer 111 and the second electrode 172 to each other.

In a case where the gate electrode opening is not formed, the reflection path for the light source can be introduced to the thin film transistor from the outside such as a lower or lateral side of the thin film transistor, which may affect the device performance. To address this issue, according to the embodiments of the present disclosure, the gate electrode opening 150*a* can be formed to guide the path of the external light source so that the light source introduced from the outside of the thin film transistor 100 is not reflected on the active layer 130 or the inside of the thin film transistor 100, but is transmitted therethrough.

As such, when the thin film transistor according to one embodiment of the present disclosure is configured to include the gate electrode opening 150*a*, it is possible to minimize an internal reflection path for the external light source. Accordingly, it is possible to prevent the electrical characteristics of the thin film transistor from being degraded by an exposure time of the external light source introduced into the inside of the thin film transistor. For example, when the active layer of the thin film transistor is continuously exposed to the external light source, a threshold voltage can be shifted to deteriorate the electrical characteristics of the thin film transistor.

Figure 3A:
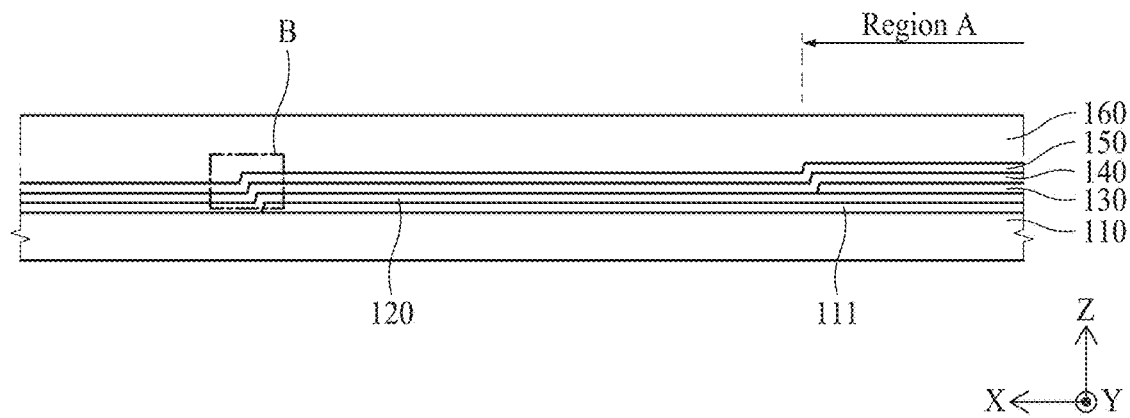
FIG. 3A is a simulation structure for an external light inflow test of the thin film transistor according to the embodiment of the present disclosure.
Figure 3B:
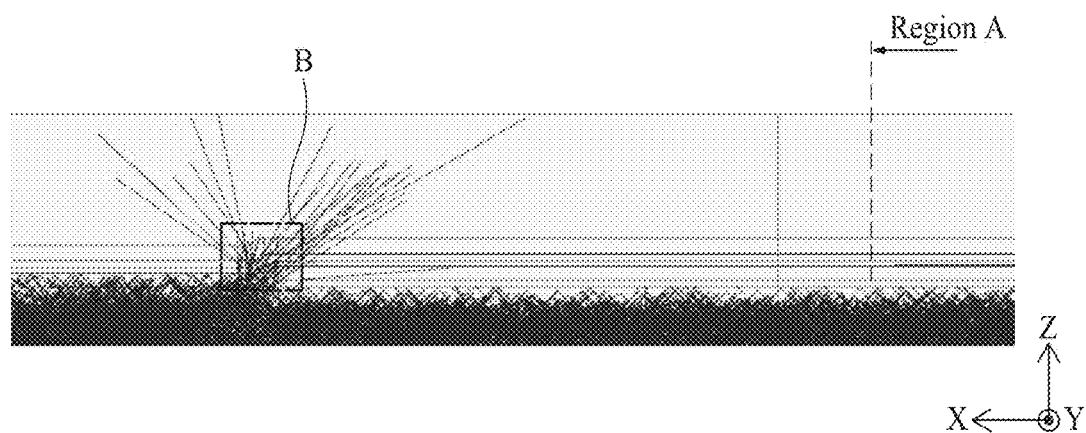
FIG. 3B is an external light inflow simulation result of the thin film transistor according to the embodiment of the present disclosure.
Figure 3C:
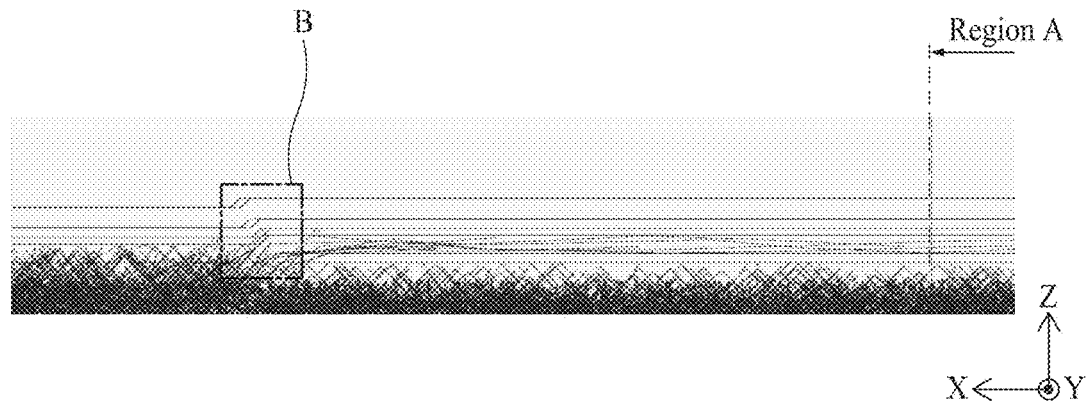
FIG. 3C is an external light inflow simulation result of a thin film transistor according to a comparative example.

FIG. 3A is a simulation structure for an external light inflow test of the thin film transistor according to the embodiment of the present disclosure, FIG. 3B is an external light inflow simulation result of the thin film transistor according to the embodiment of the present disclosure, and FIG. 3C is an external light inflow simulation result of a thin film transistor according to a comparative example.

Referring to FIG. 3A, the simulation structure for the external light inflow test of the thin film transistor according to the embodiment of the present disclosure is a structure in which the base substrate 110, the light shielding layer 111, the buffer layer 120, the active layer 130, the gate insulating film 140, the gate electrode 150, and the interlayer insulating film 160 are sequentially stacked.

In FIG. 3A, 'region A' denotes a region overlapping the active layer 130, and a portion indicated by 'B' denotes a portion corresponding to the gate electrode opening 150*a* described above (e.g., in FIG. 1). In addition, the simulation structure of FIG. 3A shows only the structure corresponding to half of the left side, based on the X-axis direction in the cross-sectional structure of FIG. 2B.

FIGS. 3B and 3C illustrate the path of the light source when the plurality of light sources are provided from the lower portion of the thin film transistor toward the thin film transistor in the simulation structure of FIG. 3A. Particularly, FIG. 3B is a structure according to the embodiment of the present disclosure including the gate electrode opening 150*a* in the portion indicated by 'B' corresponding to the gate electrode opening 150*a*, and FIG. 3C is a structure according to a comparative example in which the gate electrode opening 150*a* is not formed in the portion indicated by 'B'.

In the example of the embodiment of the present disclosure, referring to FIG. 3B, the external light incident from the lower portion is considerably discharged to the outside via the gate electrode opening 150*a*, and the external light scarcely flows into the region A in which the active layer 130 is disposed. The light that would have headed towards the region A with the active layer 130 is mostly discharged to the outside via the gate electrode opening 150*a*.

In the comparative example, referring to FIG. 3C, when the gate electrode opening is not formed at all, the external light, which is incident from the lower portion, travels along the reflection path at the portion B where the gate electrode 150 is inclined, whereby the external light source can be reflected and introduced into the inside of the thin film transistor. The gate electrode and the light shielding layer are disposed on the upper and lower sides of the portion B and the region A, respectively, so that the external light source reflected internally can reach the active layer in the comparative example of FIG. 3C, which is not desirable.

Figure 4A:
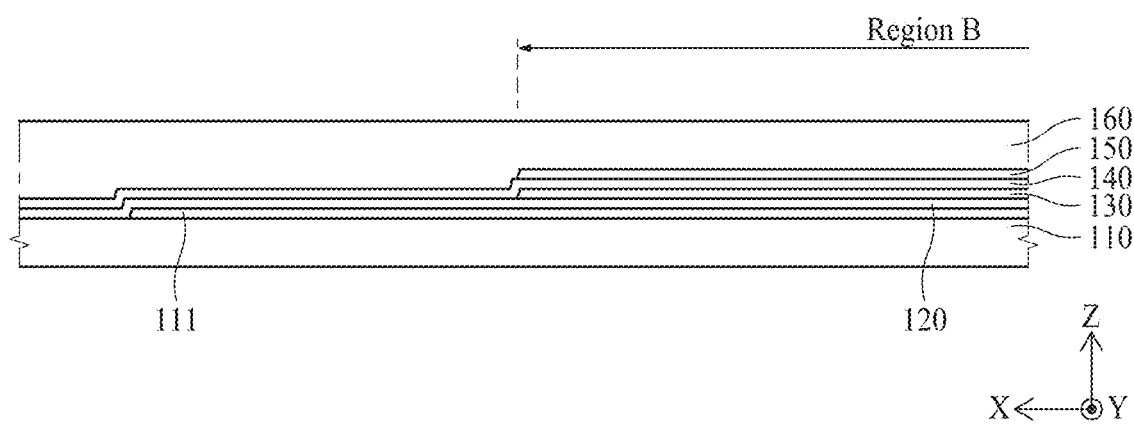
FIG. 4A is a simulation structure for an external light inflow test of a thin film transistor according to another embodiment of the present disclosure.
Figure 4B:
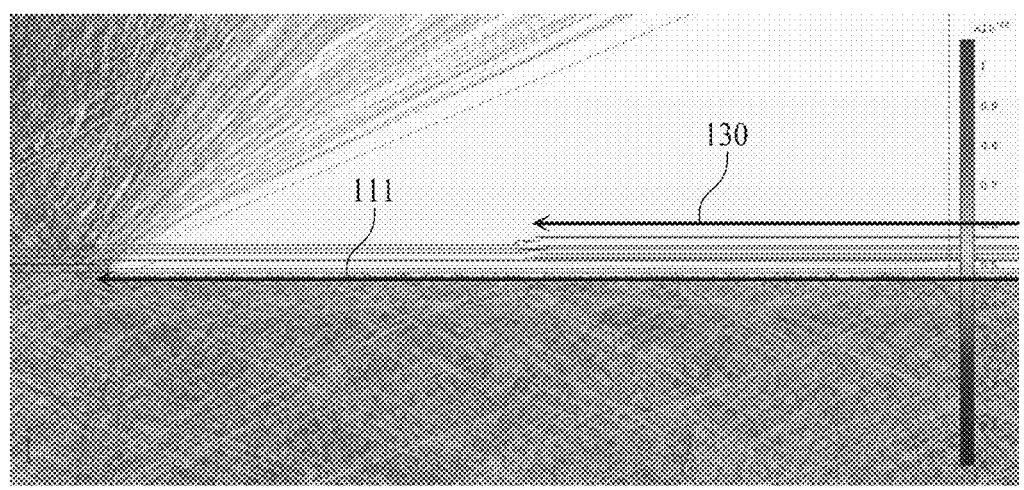
FIG. 4B is an external light inflow simulation result of the thin film transistor of FIG. 4A.

FIG. 4A is a simulation structure for an external light inflow test of a thin film transistor according to another embodiment of the present disclosure, and FIG. 4B is an external light inflow simulation result of the thin film transistor of FIG. 4A according to this embodiment of the present disclosure.

The simulation structure for the external light inflow test of the thin film transistor according to another embodiment of the present disclosure shown in FIG. 4A shows only the structure corresponding to half of the left side, based on the X-axis direction in the cross-sectional structure of FIG. 2A. In FIG. 4A, 'region B' denotes a region in which an active layer 130 overlaps a gate electrode 150. In this example, the gate electrode 150 is formed in region B, but not outside region B.

Referring to FIG. 4B, when the gate electrode 150 is not formed in the path where the external light is introduced (i.e., the gate electrode 150 is formed only in region B), the external light incident from the lower portion of the thin film transistor is prevented from propagating to the active layer 130, and does not have any effect on the active layer 130.

Referring to FIG. 1, FIG. 2A, FIG. 2B, FIG. 3B, and FIG. 4B according to the embodiments of the present disclosure, the external light flowing in the direction parallel to the gate electrode 150 can be a main factor affecting the electrical characteristics of the thin film transistor 100 by the external light source incident from the outside. If the gate electrode 150 overlaps at least a portion of the light shielding layer 111, and the inclined surface is formed in the gate electrode 150, the external light can be reflected on the inclined surface B (e.g., FIG. 3A) of the gate electrode, whereby the external light can be prevented from being near the active layer.

Figure 5:
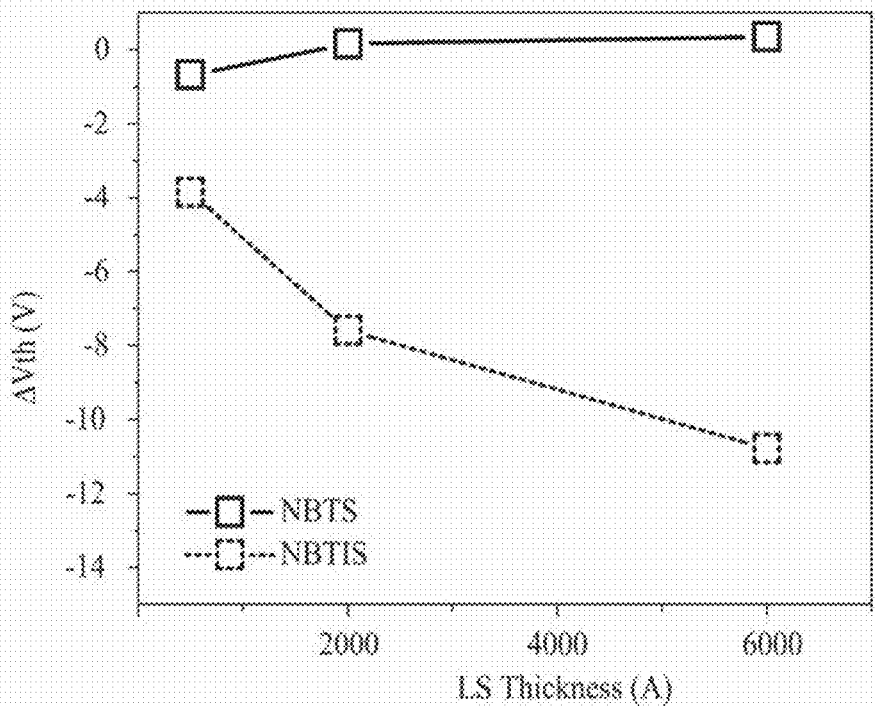
FIG. 5 shows an example of results of NBTIS (Negative Bias Temperature Illumination Stress) and NBTS (Negative Bias Temperature Stress) according to a thickness and a threshold voltage of a light shielding layer.

FIG. 5 shows results of NBTIS and NBTS according to a thickness (horizontal axis) and a threshold voltage (vertical axis) of the light shielding layer. In FIG. 5, a solid line shows the result of NBTS, and a dotted line shows the result of NBTIS. In the present disclosure, when the gate electrode 150 is provided above the light shielding layer 111, and the gate electrode 150 is configured to overlap with the light shielding layer 111, the inclined portion of the gate electrode 150 can be increased according to the increase in the thickness of the light shielding layer 111.

Referring to FIG. 5, if there is no light source irradiation, there is no change in the threshold voltage, substantially. In contrast, if the light source is irradiated, the external light source reflection path and the external light source inflow by the gate electrode can be increased according to the increase in the thickness of the light shielding layer, whereby the electrical characteristics of the thin film transistor can be effected.

Figure 6:
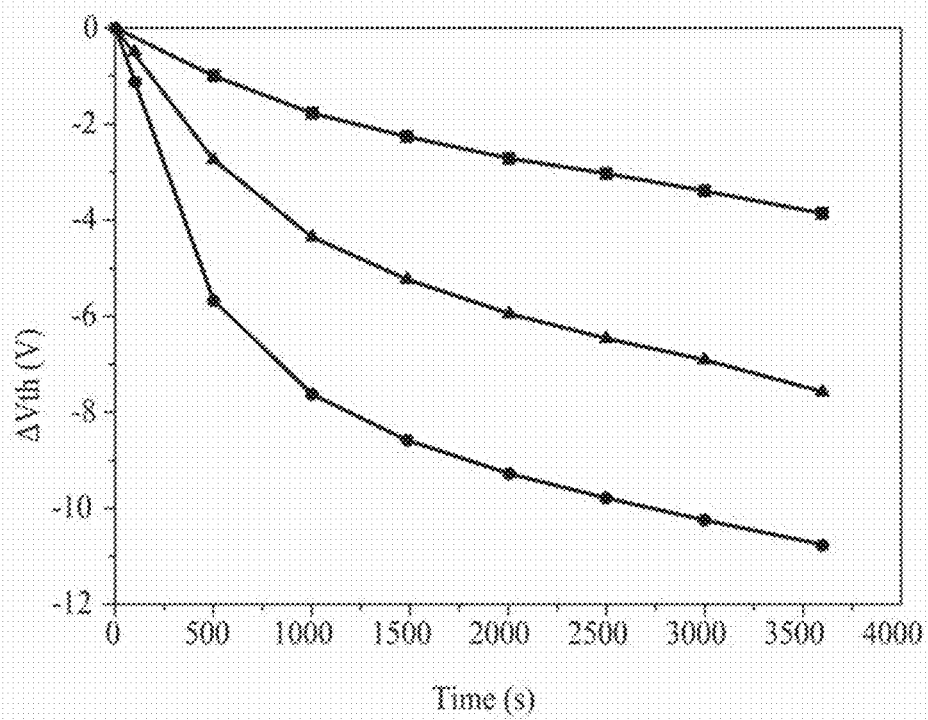
FIG. 6 shows the change according to the time of NBTIS when the thickness of the light shielding layer according to the present disclosure changes.

FIG. 6 shows an example of the change according to the time of NBTIS when the thickness of the light shielding layer according to the present disclosure changes. In FIG. 6, the data shown by the rectangular shape (top line) represent the thickness of the light shielding layer corresponding to 'MoTi 30 nm' and 'Cu 50 nm', the data shown by the triangular shape (middle line) represent the thickness of the light shielding layer corresponding to 'MoTi 30 nm' and 'Cu 200 nm', and the data shown by the circular shape (bottom line) represent the thickness of the light shielding layer corresponding to 'MoTi 30 nm' and 'Cu 600 nm'. The thickness of the light shielding layer is increased from the top line to the bottom line shown in FIG. 6.

Referring to FIG. 6, after carrying out the NBTIS regardless of the thickness of the light shielding layer, the threshold voltage decreases linearly up to 4000 seconds by the elapse of time. Particularly, as the thickness of the light shielding layer increases more (e.g., from the top to bottom lines), the decrease in the threshold voltage becomes greater. That is, the thickness of the light shielding layer in the top line is less than that of the second line, which is less than that of the bottom line shown in the graph of FIG. 6. On the other hand, the amount of decreases in the threshold voltage (vertical axis) in the graph of FIG. 6 is greatest in the bottom line than the middle or top line in the graph of FIG. 6.

Figure 7:
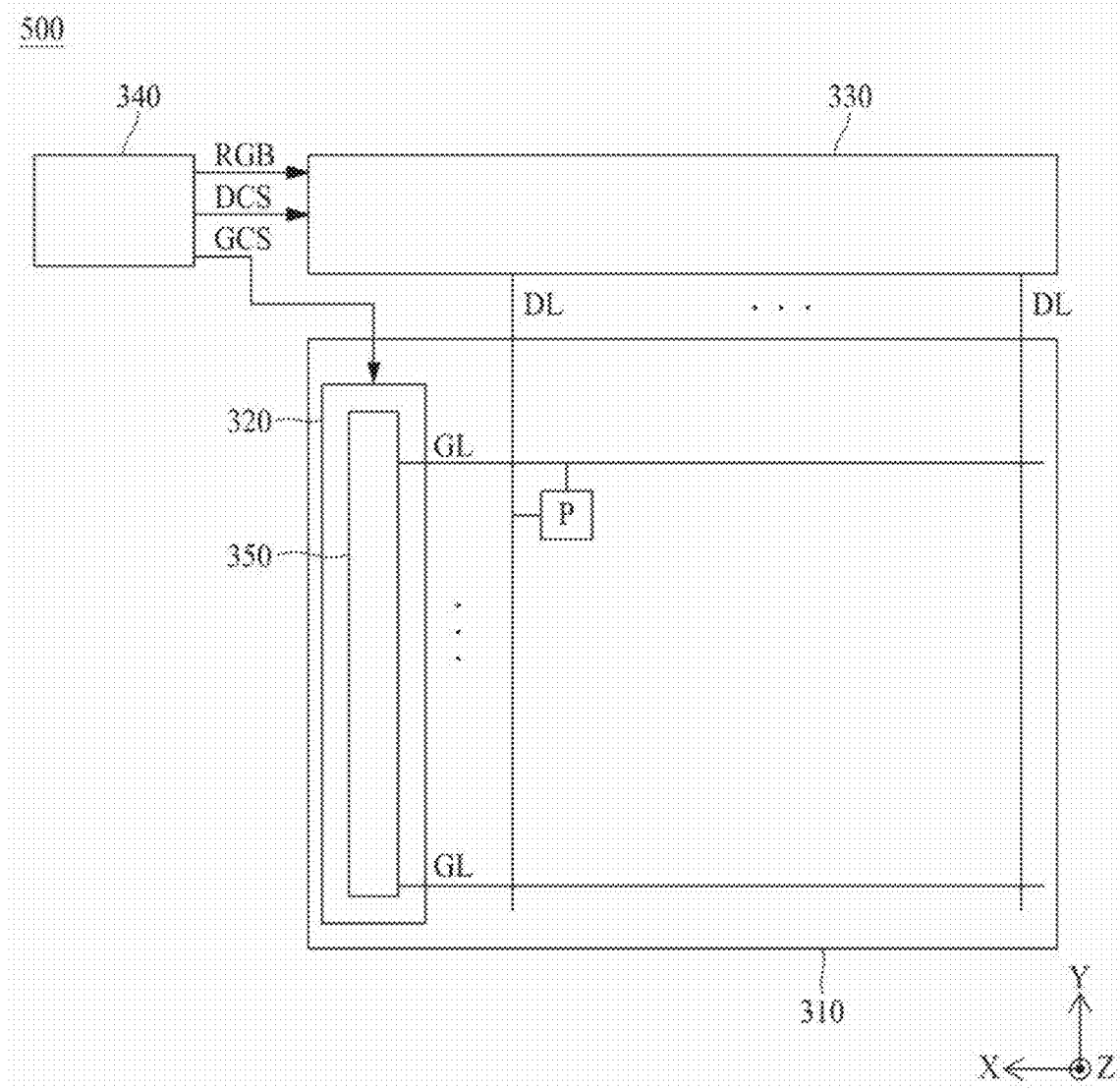
FIG. 7 is a schematic diagram of a display apparatus according to an embodiment of the present disclosure.

FIG. 7 is a schematic diagram of a display apparatus according to an embodiment of the present disclosure.

As shown in FIG. 7, a display apparatus 500 according to an embodiment of the present disclosure includes a display panel 310, a gate driver 320, a data driver 330, and a controller 340.

Gate lines GL and data lines DL are disposed on the display panel 310, and pixels P are disposed in respective crossing areas of the gate lines GL and the data lines DL. An image is displayed by driving the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system. Also, the controller 340 samples input video data input from the external system and rearranges the sampled input video data, and supplies the rearranged digital video data RGB to the data driver 330.

The gate control signal GCS includes a gate start pulse GSP, a gate shift clock GSC, a gate output enable signal GOE, a start signal Vst, and a gate clock GCLK. Further, control signals for controlling a shift register can be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. Specifically, the data driver 330 converts the video data RGB inputted from the controller 340 into an analog data voltage and supplies the data voltage to the data lines DL.

The gate driver 320 can include a shift register 350.

The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Also, during the remaining period of one frame, in which the gate pulse is not supplied, the shift register 350 supplies a gate-off signal capable of turning off the switching device to the gate line GL. Hereinafter, the gate pulse and the gate-off signal are totally referred to as a scan signal SS or Scan.

According to the embodiment of the present disclosure, the gate driver 320 can be mounted on a base substrate 110 (e.g., the base substrate 110 of FIG. 1). As described above, a structure in which the gate driver 320 is directly mounted on the base substrate 110 is referred to as a gate-in-panel GIP structure.

Figure 8:
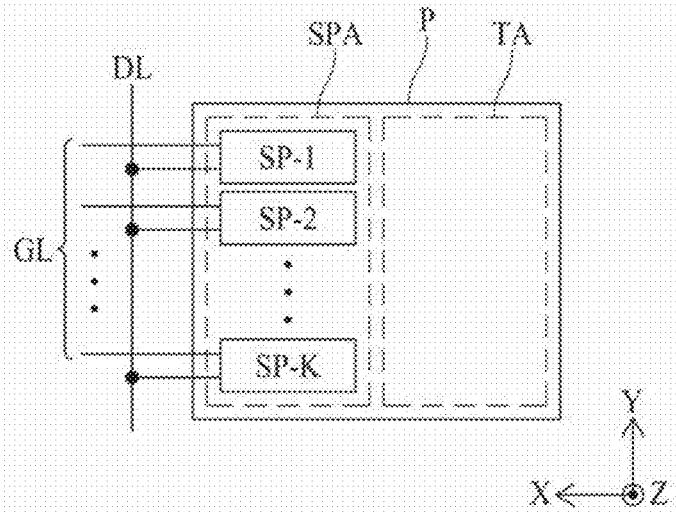
FIG. 8 illustrates an arrangement structure of a subpixel and a transmission area in an organic light emitting display apparatus according to one embodiment of the present disclosure.
Figure 9:
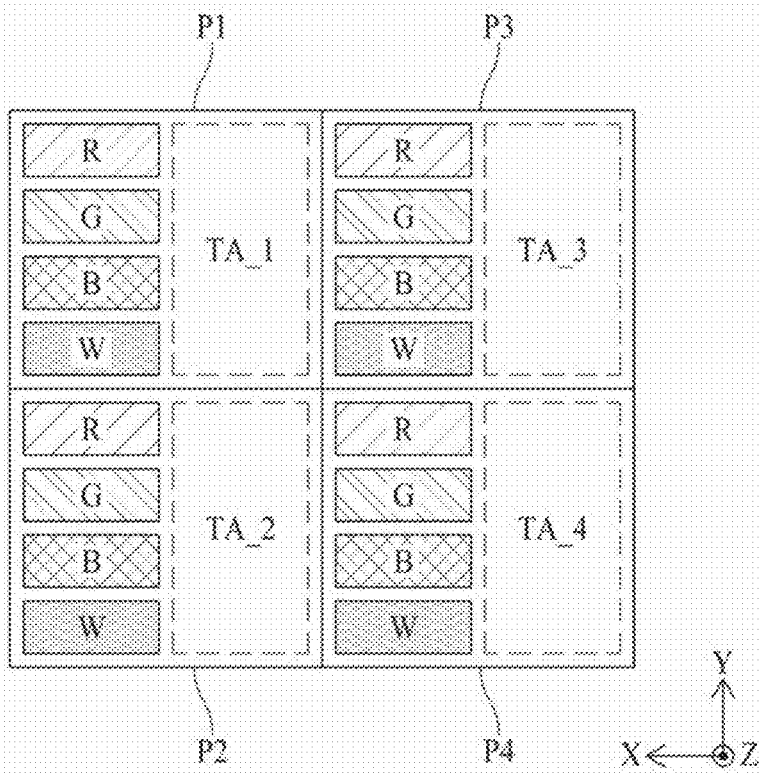
FIG. 9 is an exemplary view illustrating an arrangement structure of a subpixel and a transmission area according to one embodiment of the present disclosure.

FIG. 8 illustrates an arrangement structure of a subpixel and a transmission area in an organic light emitting display apparatus according to one embodiment of the present disclosure, and FIG. 9 is an exemplary view illustrating an arrangement structure of a subpixel and a transmission area according to one embodiment of the present disclosure. The pixel configuration of FIG. 8 or 9 can be used in each pixel P of the display apparatus 500.

Referring to FIG. 8, each pixel P can include a subpixel area SPA in which 'K' subpixels SP, SP_1, SP_2, . . . , SP_K are formed to express different colors, and a transmission area (transparent area) TA. Herein, 'K' which indicates the number of subpixels included in one pixel P can be '3' or '4', or can be '2', or an integer of 5 or more.

Also, in FIG. 8 and FIG. 9, each pixel P can include a transmission area TA, but is not limited thereto. For example, the organic light emitting display apparatus according to the present disclosure may not include the transmission area TA.

Referring to FIG. 8, in each pixel P, the subpixels SP_1, . . . , SP_K can be disposed adjacent to each other in a first direction. Referring to FIG. 8, the transmission area TA can be disposed adjacent to the subpixel area SPA in a second direction. That is, the transmission area TA can be disposed adjacent to the subpixels SP_1, . . . , SP_K in the second direction.

As described above, since each unit pixel P can include the transmission area TA, it can have a transparent structure. Owing to the structure of the pixel P including the transmission area TA, the organic light emitting display apparatus according to the present disclosure can transmit external light. Accordingly, the organic light emitting display apparatus according to the present disclosure can be a transparent organic light emitting display apparatus.

FIG. 9 is a diagram illustrating a structure of a subpixel and a transmission area according to one embodiment of the present disclosure. Referring to FIG. 9, in case of a 4-subpixel-based pixel arrangement structure, each of the plurality of pixels P1, P2, P3, and P4 can include all subpixels corresponding to red R, green G, blue B, and white W. Also, the subpixels of each pixel can have a color arrangement in which red R, green G, blue B, and white W are arranged in a predetermined order. In addition, an area defined by the plurality of subpixels can be defined as a light emission area, and each pixel can include a transmission area corresponding to the arrangement structure of the subpixels.

Also, the subpixels of the first pixel P1 can be sequentially arranged along the first direction in order of red R, green G, blue B, and white W, and the subpixels in each of the second pixel P2, the third pixel P3, and the fourth pixel P4 can be arranged in the same manner as the above. The first pixel P1, the second pixel P2, the third pixel P3, and the fourth pixel P4 can include respectively the transmission areas TA_1, TA_2, TA_3, and TA_4 corresponding to the respective subpixels.

Figure 10:
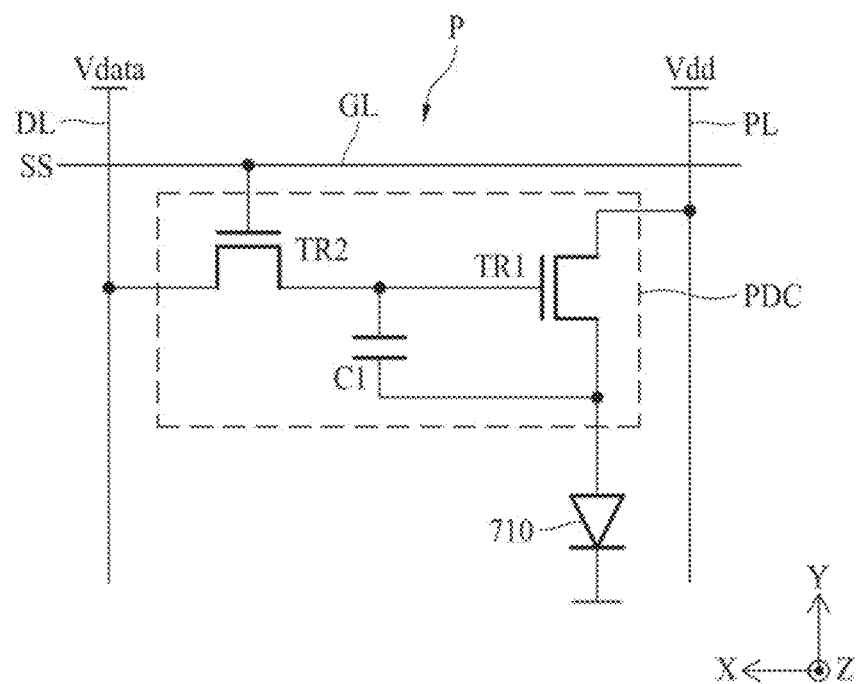
FIG. 10 is a circuit diagram of one pixel P in a display apparatus according to an embodiment of the present disclosure.
Figure 11:
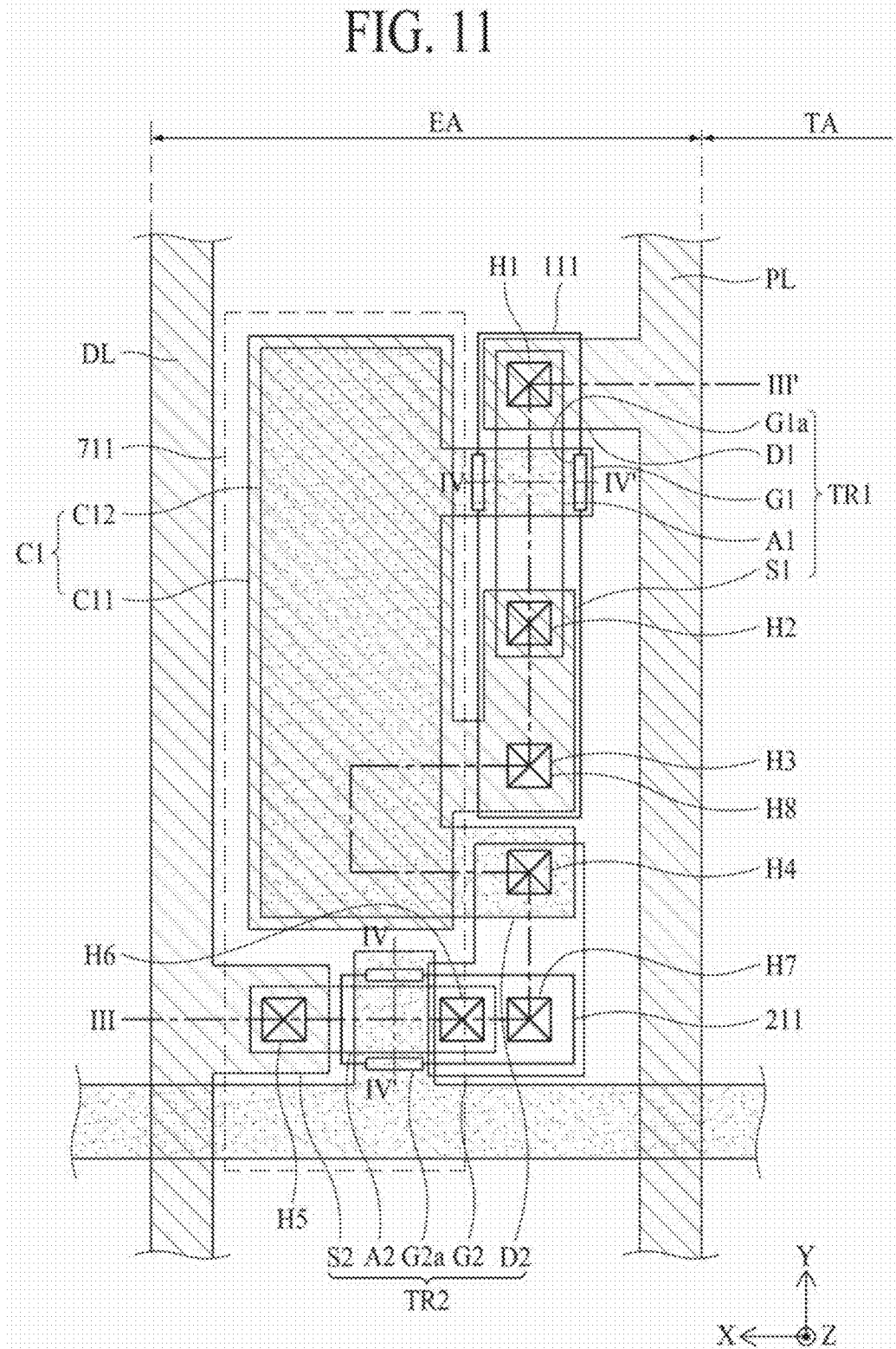
FIG. 11 is a plan view of the pixel P of FIG. 10.
Figure 12:
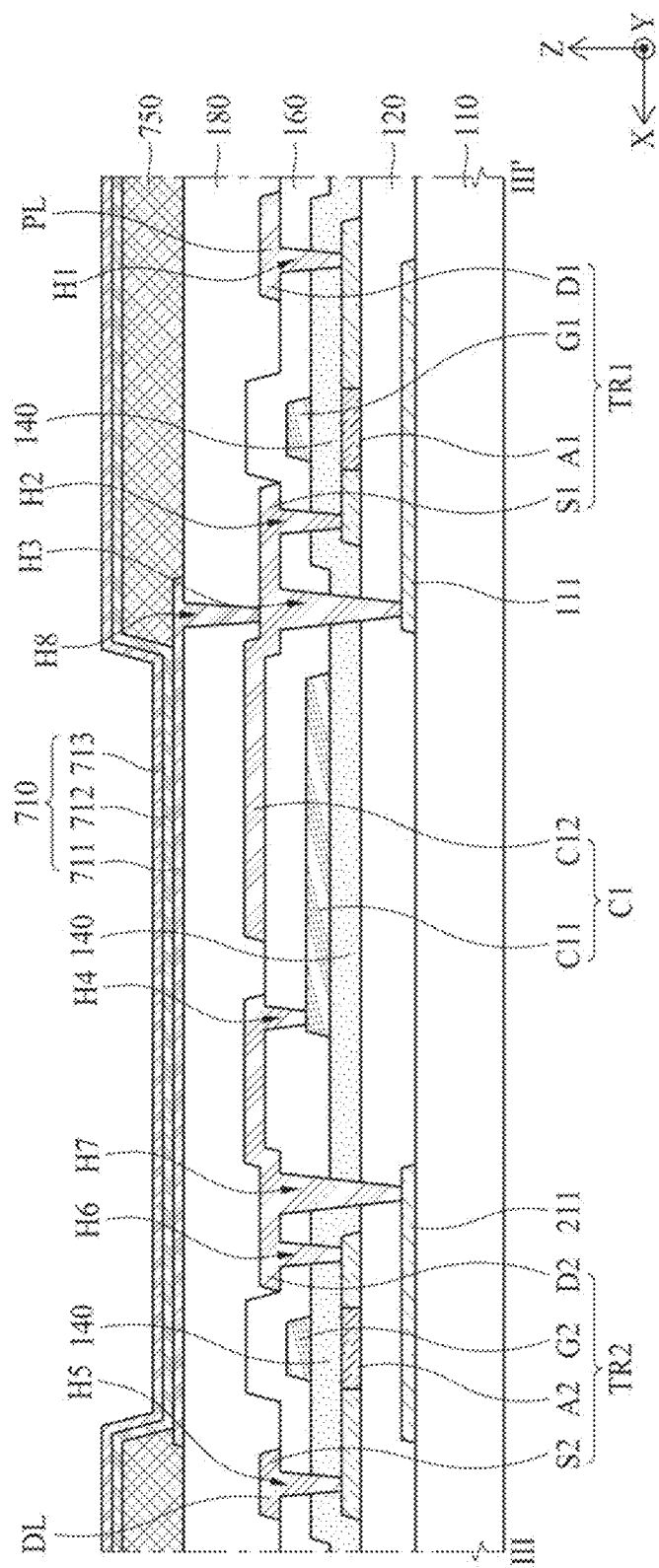
FIG. 12 is a cross sectional view along line III-III' of FIG. 11.
Figure 13:
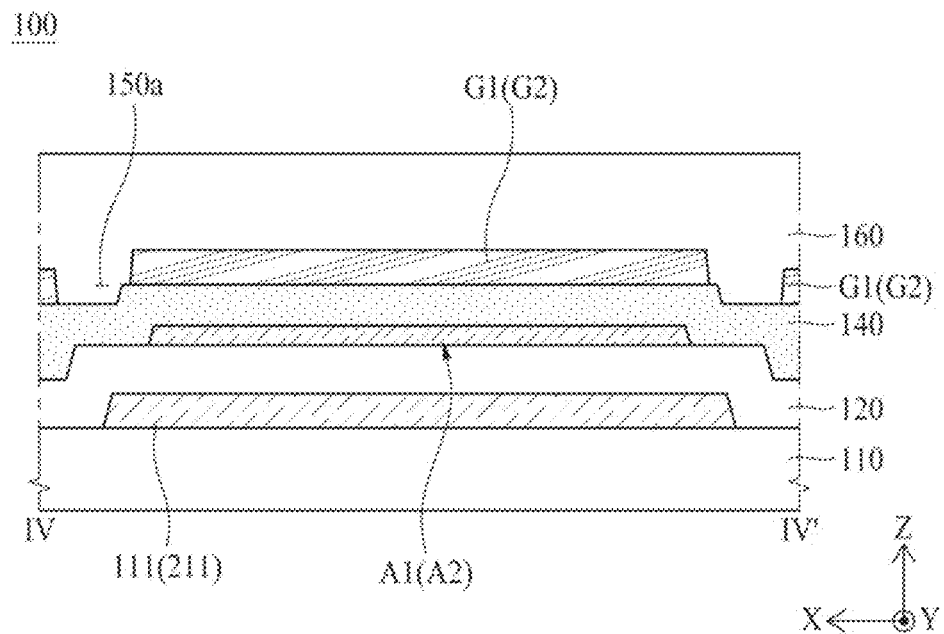
FIG. 13 is a cross sectional view along line IV-IV of FIG. 11.

FIG. 10 is a circuit diagram of one pixel P in a display apparatus according to an embodiment of the present disclosure, FIG. 11 is a plan view of the pixel P of FIG. 10, FIG. 12 is a cross-sectional view along line III-III' of FIG. 11, and FIG. 13 is a cross-sectional view along each line IV-IV of FIG. 11.

The circuit diagram of the pixel P in FIG. 10 is an equivalent circuit diagram of a pixel P of a display apparatus including an organic light emitting diode OLED. The pixel P includes a display device (or a display element) 710, and a pixel driver PDC for driving the display device 710. An example of the display device 710 can be the OLED.

According to an embodiment of the present disclosure, the display apparatus includes the pixel driver PDC and the display device 710 for each of the plurality pixels provided in the display apparatus. The pixel driver PDC includes a first thin film transistor TR1 and a second thin film transistor TR2. The first thin film transistor TR1 and/or the second thin film transistor TR2 can include the thin film transistors 100 described above.

According to another embodiment of the present disclosure, the first thin film transistor TR1 is a driving transistor, and the second thin film transistor TR2 is a switching transistor.

The second thin film transistor TR2 is connected to a gate line GL and a data line DL of the display apparatus, and is turned on or off by a scan signal SS supplied through the gate line GL.

The data line DL provides a data voltage Vdata to the pixel driver PDC, and the second thin film transistor TR2 controls the application of the data voltage Vdata.

A driving power line PL of the display apparatus provides a driving voltage Vdd to the display device 710, and the first thin film transistor TR1 controls the driving voltage Vdd. The driving voltage Vdd is a pixel driving voltage for driving an organic light emitting diode OLED corresponding to the display device 710.

When the second thin film transistor TR2 is turned on by the scan signal SS applied through the gate line GL from a gate driver, the data voltage Vdata supplied through the data line DL is supplied to a gate electrode of the first thin film transistor TR1 connected to the display device 710. The data voltage Vdata is charged to a storage capacitor C1 formed between the gate electrode of the first thin film transistor TR1 and a source electrode of the first thin film transistor TR1.

An amount of current supplied to the organic light emitting diode OLED corresponding to the display device 710 through the first thin film transistor TR1 is controlled by the data voltage Vdata, whereby a grayscale of light emitted from the display device 710 can be controlled.

Referring to FIGS. 11 and 12, the first thin film transistor TR1 and the second thin film transistor TR2 are disposed on a base substrate 110 (e.g., the base substrate of FIG. 1). Referring to FIG. 11, the display apparatus according to one embodiment of the present disclosure is a transparent display apparatus including a plurality of transmission areas TA and emission areas EA. Therefore, the transparent display apparatus can increase the path in which the external light source in the transmissive area TA may be introduced into the emission area EA.

However, the thin film transistor (e.g., TR1, TR2) according to the embodiment of the present disclosure includes the gate electrode opening 150a illustrated in FIGS. 1 to 6, thereby reducing or eliminating an issue which may be caused by reflection of the external light. The base substrate 110 can be made of glass or plastic. For example, the base substrate 110 can be formed of plastic having flexibility, for example, polyimide PI.

Then, light shielding layers 111 and 211 are disposed on the base substrate 110. The light shielding layers 111 and 211 block the external light which can be being incident from the outside, to thereby protect an active layer 130.

A buffer layer 120 is disposed on the light shielding layers 111 and 211. The buffer layer 120 is made of an insulating material, and is configured to protect the active layer 130 from moisture or oxygen introduced from the outside.

An active layer A1 of the first thin film transistor TR1 and an active layer A2 of the second thin film transistor TR2 are disposed on the buffer layer 120. For example, the active layers A1 and A2 can include an oxide semiconductor material. The active layers A1 and A2 can be formed of an oxide semiconductor layer of the oxide semiconductor material.

A gate insulating film 140 is disposed on the active layers A1 and A2.

A first gate electrode G1 of the first thin film transistor TR1 and a second gate electrode G2 of the second thin film transistor TR2 are disposed on the gate insulating film 140. The second gate electrode G2 is disposed on the same layer as the first gate electrode G1. Herein, the first gate electrode G1 and the second gate electrode G2 can be identical in structure to the gate electrode 150 described above.

Also, the gate line GL can be disposed on the gate insulating film 140. The gate electrode G2 of the second thin film transistor TR2 can extend from the gate line GL. However, the embodiments of the present disclosure are not limited thereto, and a portion of the gate line GL can be the gate electrode G2 of the second thin film transistor TR2.

A first capacitor electrode C11 of the storage capacitor C1 is disposed on the gate insulating film 140. The first capacitor electrode C11 can be connected to the first gate electrode G1 of the first thin film transistor TR1. The first capacitor electrode C11 can be integrated into the first gate electrode G1 of the first thin film transistor TR1 as one body.

An interlayer insulating film 160 is disposed on the first gate electrode G1 of the first thin film transistor TR1, the second gate electrode G2 of the second thin film transistor TR2, the gate line GL, and the first capacitor electrode C11. The interlayer insulating film 160 can be made of an organic or inorganic insulating material.

A source electrode S1 and a drain electrode D1 of the first thin film transistor TR1 are disposed on the interlayer insulating film 160. The source electrode S1 of the first thin film transistor TR1 can be referred to as a first electrode 171, and the drain electrode D1 of the first thin film transistor TR1 can be referred to as a second electrode 172 as in the thin film transistor 100 of FIGS. 1-6.

Also, a source electrode S2 and a drain electrode D2 of the second thin film transistor TR2 are disposed on the interlayer insulating film 160. A data line DL, a driving power line PL, and a second capacitor electrode C12 of the storage capacitor C1 can be disposed on the interlayer insulating film 160.

A portion of the driving power line PL can extend and can be the drain electrode D1 of the first thin film transistor TR1. The drain electrode D1 of the first thin film transistor TR1 is connected to the active layer A1 through a first contact hole H1.

The source electrode S1 of the first thin film transistor TR1 can be connected to the active layer A1 through a second contact hole H2 and can be connected to the light shielding layer 111 through a third contact hole H3.

The source electrode S1 of the first thin film transistor TR1 and the second capacitor electrode C12 are connected to each other. The source electrode S1 of the first thin film transistor TR1 and the second capacitor electrode C12 can be integrally formed as one body.

A portion of the data line DL can extend and can be the source electrode S2 of the second thin film transistor TR2. The source electrode S2 of the second thin film transistor TR2 can be connected to the active layer A2 through a fifth contact hole H5.

The drain electrode D2 of the second thin film transistor TR2 is connected to the active layer A2 through a sixth contact hole H6, is connected to the first capacitor electrode C11 through a fourth contact hole H4, and can be connected to the light shielding layer 211 through a seventh contact hole H7.

A planarization layer 180 is disposed on the source electrode S1 and the first drain electrode D1 of the first thin film transistor TR1, the source electrode S2 and the second drain electrode D2 of the second thin film transistor TR2, the data line DL, the driving power line PL, and the second capacitor electrode C12.

The planarization layer 180 is formed of an insulating layer, and is configured to planarize an upper portion of the first thin film transistor TR1 and an upper portion of the second thin film transistor TR2, and to protect the first thin film transistor TR1 and the second thin film transistor TR2.

A first pixel electrode 711 of the display device 710 is disposed on the planarization layer 180. The first pixel electrode 711 contacts the second capacitor electrode C12 through an eighth contact hole H8 formed in the planarization layer 180. As a result, the first pixel electrode 711 can be connected to the source electrode S1 of the first thin film transistor TR1. The eighth contact hole H8 formed in the planarization layer 180 can be formed in a non-opening portion of the display device 710 while being overlapped with a bank layer 750.

The bank layer 750 is disposed at an edge of the first pixel electrode 711. The bank layer 750 defines the emission area EA of the display device 710.

An organic light emitting layer 712 is disposed on the first pixel electrode 711, and a second pixel electrode 713 is disposed on the organic light emitting layer 712, to thereby form the display device 710. The display device 710 shown in FIGS. 11 and 12 is an organic light emitting diode OLED. Accordingly, a display apparatus 500 according to another embodiment of the present disclosure is an organic light emitting display apparatus.

As a structure of FIG. 13 is the same as or very similar to that of FIG. 2B, a detailed description thereof will be omitted. For instance, as shown in FIG. 13, the gate electrode openings 150a are provided in the gate electrode G1, G2 that overlaps the active layer A1, A2 and the light shieling layer 111, 211.

Figure 14:
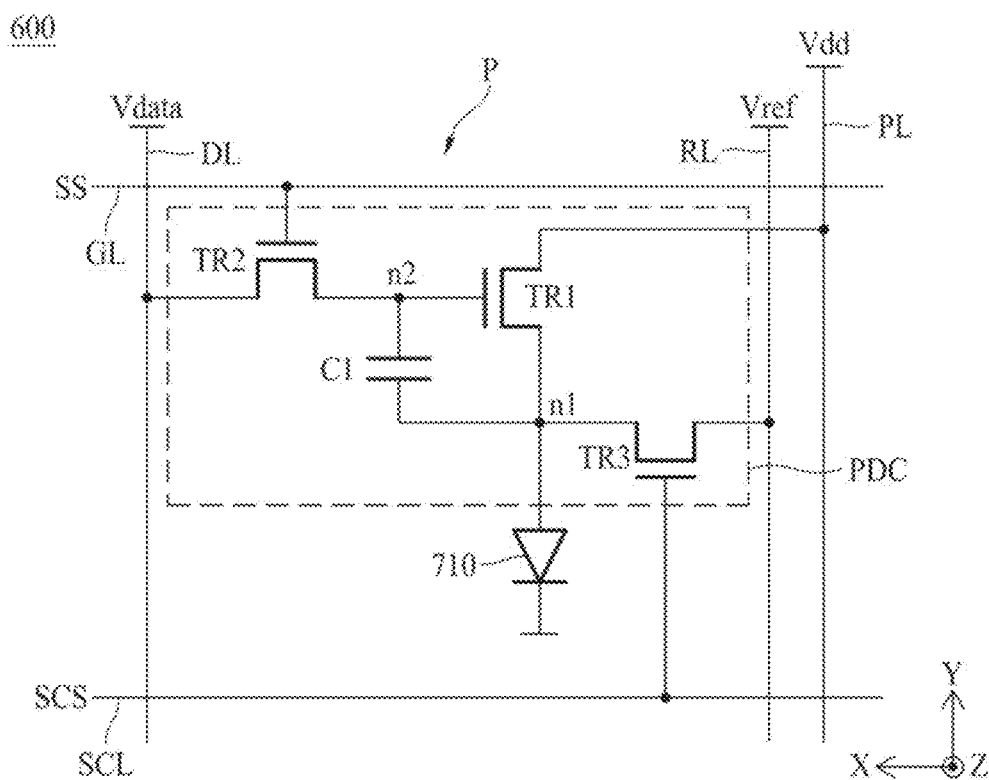
FIG. 14 is a circuit diagram of any one pixel of a display apparatus according to another embodiment of the present disclosure.

FIG. 14 is a circuit diagram of one pixel of a display apparatus according to another embodiment of the present disclosure. Particularly, FIG. 14 can be an equivalent circuit diagram of each pixel P among a plurality of pixels in an organic light emitting display apparatus 600 according to an embodiment of the present disclosure.

The pixel P of the display apparatus 600 shown in FIG. 14 includes an organic light emitting diode OLED corresponding to a display device (or device element) 710, and a pixel driver PDC for driving the display device 710. The display device 710 is connected to the pixel driver PDC.

In the pixel P, there are signal lines DL, GL, PL, RL, and SCL to supply a signal to the pixel driver PDC.

A data voltage Vdata is supplied to a data line DL, a scan signal SS is supplied to a gate line GL, a driving voltage Vdd for driving the pixel is supplied to a driving power line PL, a reference voltage Vref is supplied to a reference line RL, and a sensing control signal SCS is supplied to a sensing control line SCL.

For example, the pixel driver PDC includes a second thin film transistor TR2 (switching transistor) connected to the gate line GL and the data line DL, a first thin film transistor TR1 (driving transistor) for controlling a level of current output to the display device 710 according to the data voltage Vdata transmitted through the second thin film transistor TR2, and a third thin film transistor TR3 (reference transistor) for sensing the characteristics of the first thin film transistor TR1. In examples, one or more of the first to third transistors TR1-TR3 can have the configuration of the TFT 100 of FIGS. 1-6, e.g., with one or more gate electrode openings 150a.

A storage capacitor C1 is disposed between a gate electrode of the first thin film transistor TR1 and the display device 710.

The second thin film transistor TR2 is turned on by the scan signal SS supplied to the gate line GL, and the turned-on second thin film transistor TR2 transmits the data voltage Vdata supplied to the data line DL to the gate electrode of the first thin film transistor TR1.

The third thin film transistor TR3 is connected to the reference line RL and a first node n1 between the first thin film transistor TR1 and the display device 710, and is turned on or off by the sensing control signal SCS, and senses the characteristics of the first thin film transistor TR1 corresponding to the driving transistor for a sensing period.

A second node n2 connected to the gate electrode of the first thin film transistor TR1 is connected to the second thin film transistor TR2. The storage capacitor C1 is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged to the first capacitor C1 formed between the gate electrode and source electrode of the first thin film transistor TR1.

When the first thin film transistor TR1 is turned on, the current is supplied to the display device 710 through the first thin film transistor TR1 by the driving voltage Vdd for driving the pixel, whereby light is emitted from the display device 710.

Figure 15:
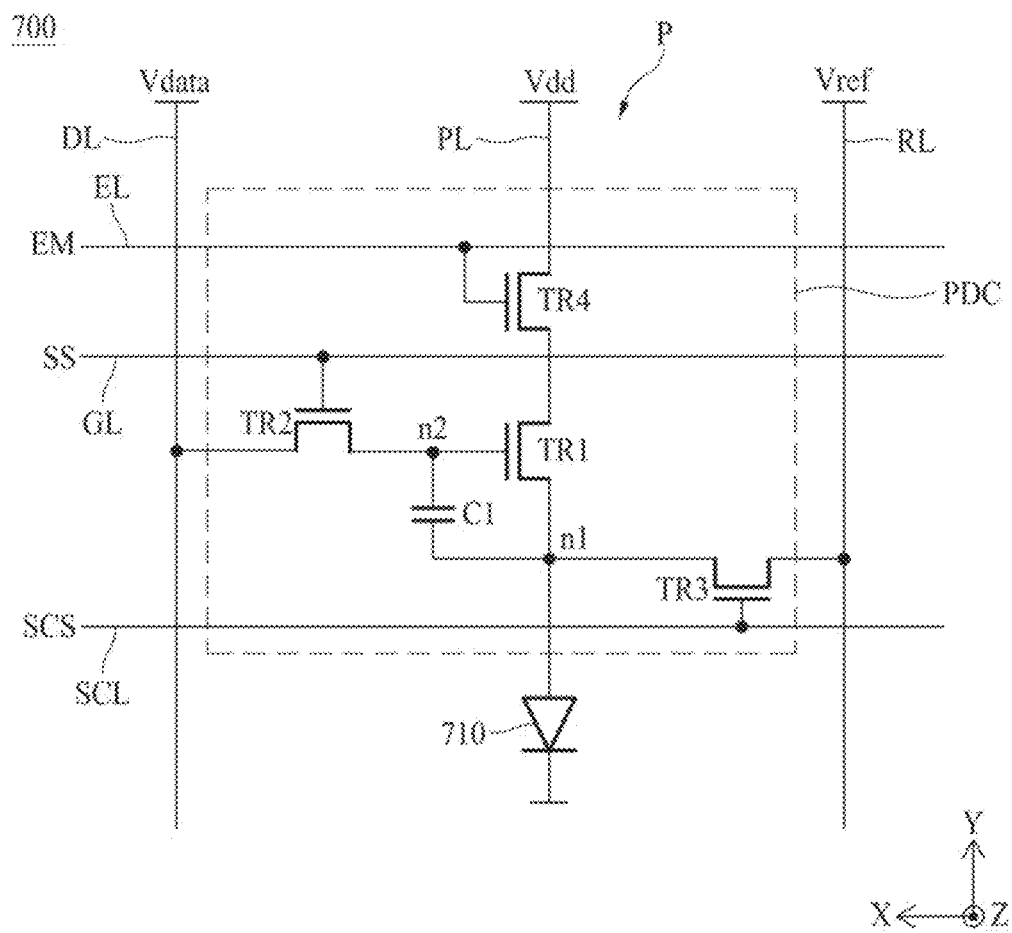
FIG. 15 is a circuit diagram of any one pixel of a display apparatus according to another embodiment of the present disclosure.

FIG. 15 is a circuit diagram of any one pixel of a display apparatus according to another embodiment of the present disclosure. Particularly, FIG. 15 can be an equivalent circuit diagram of each pixel P among a plurality of pixels in an organic light emitting display apparatus 700 according to an embodiment of the present disclosure.

The pixel P of the display apparatus 700 shown in FIG. 15 includes an organic light emitting diode OLED corresponding to a display device (or display element) 710, and a pixel driver PDC for driving the display device 710. The display device 710 is connected to the pixel driver PDC.

The pixel driver PDC includes thin film transistors TR1, TR2, TR3, and TR4. In examples, one or more of the first to fourth transistors TR1-TR4 can have the configuration of the TFT 100 of FIGS. 1-6, e.g., with one or more gate electrode openings 150a.

In the pixel P, there are signal lines DL, EL, GL, PL, SCL, and RL to supply a driving signal to the pixel driver PDC.

In comparison to the pixel P of FIG. 14, the pixel P of FIG. 15 further includes an emission control line EL. An emission control signal EM is supplied to the emission control line EL.

Also, in comparison to the pixel driver PDC of FIG. 14, the pixel driver PDC of FIG. 15 further includes the fourth thin film transistor TR4, which is a light emitting control transistor for controlling an emission time point of the first thin film transistor TR1.

A storage capacitor C1 is disposed between a gate electrode of the first thin film transistor TR1 and the display device 710.

The second thin film transistor TR2 is turned on by a scan signal SS supplied to a gate line GL, and transmits a data voltage Vdata supplied to a data line DL to the gate electrode of the first thin film transistor TR1.

The third thin film transistor TR3 is connected to a reference line RL and is turned on or off by a sensing control signal SCS, and senses the characteristics of the first thin film transistor TR1 corresponding to a driving transistor for a sensing period.

The fourth thin film transistor TR4 transfers a driving voltage Vdd to the first thin film transistor TR1 or blocks the driving voltage Vdd according to the emission control signal EM. When the fourth thin film transistor TR4 is turned on, a current is supplied to the first thin film transistor TR1, whereby light is emitted from the display device 710.

The pixel driver PDC according to another embodiment of the present disclosure can be formed in various structures in addition to the above-described structures. For example, the pixel driver PDC can include five or more thin film transistors.

According to the embodiments of the present disclosure, the thin film transistor includes one or more gate electrode openings. Thus, the external light is not introduced into the active layer or into the inside of the thin film transistor, but is transmitted to the outside of the thin film transistor, to thereby prevent a deterioration of the electrical characteristics in the thin film transistor by the elapse of time.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A thin film transistor comprising:
   a light shielding layer on a substrate;
   a buffer layer on the light shielding layer;
   an active layer on the buffer layer;
   a gate insulating layer on the active layer; and
   a gate electrode on the gate insulating layer,
   wherein the gate electrode includes a first gate electrode opening disposed within the gate electrode, and
   wherein the first gate electrode opening is not overlapped with the active layer.

2. The thin film transistor according to claim 1, wherein the first gate electrode opening is provided in an inclined portion of the gate electrode.

3. The thin film transistor according to claim 1, further comprising an interlayer insulating film on the gate electrode,
   wherein the first gate electrode opening is filled with the interlayer insulating film.

4. The thin film transistor according to claim 1, wherein the gate electrode extends in a first direction,
   the active layer and the light shielding layer extend in a second direction substantially perpendicular to the first direction, and
   the first gate electrode opening extends in the second direction.

5. The thin film transistor according to claim 1, wherein the active layer includes a gallium-based oxide semiconductor material.

6. The thin film transistor according to claim 1, wherein the active layer includes at least one of IGZO (InGaZnO)-based oxide semiconductor, GZO (GaZnO)-based oxide semiconductor, IGO (InGaO)-based oxide semiconductor, IGZTO (InGaZnSnO)-based oxide semiconductor, GZTO (GaZnSnO)-based oxide semiconductor, IZO (InZnO)-based oxide semiconductor, ITZO (InSnZnO)-based oxide semiconductor, FIZO (FeInZnO)-based oxide semiconductor, ZnO-based oxide semiconductor, and SIZO (SiInZnO)-based oxide semiconductor.

7. The thin film transistor according to claim 1, wherein a portion of the first gate electrode opening overlaps an edge portion of the light shielding layer.

8. The thin film transistor according to claim 7, wherein another portion of the first gate electrode opening is not overlapped with the light shielding layer.

9. The thin film transistor according to claim 1, wherein the gate electrode further includes a second gate electrode opening disposed within the gate electrode, and
wherein the first and second gate electrode openings are disposed on opposite sides of the active layer, respectively.

10. The thin film transistor according to claim 9, wherein at least one of the first and second gate electrode openings is overlapped with a portion of the light shielding layer, but is not overlapped with the active layer.

11. The thin film transistor according to claim 1, further comprising:
a first electrode disposed on the gate electrode and connected to the active layer through a first contact hole; and
a second electrode disposed on the gate electrode and connected to the active layer through a second contact hole,
wherein the second electrode is connected to the light shielding layer through a third contact hole.

12. The thin film transistor according to claim 11, wherein the first gate electrode opening is separated from and is not overlapped with the first contact hole, the second contact hole, and the third contact hole.

13. The thin film transistor according to claim 11, wherein the first gate electrode opening is separated from and is not overlapped with the first electrode and the second electrode.

14. A display apparatus comprising:
a pixel driver; and
a display element connected to the pixel driver,
wherein the pixel driver includes a plurality of transistors, each of at least one of the plurality of thin film transistors being the thin film transistor of claim 1.

15. The display apparatus according to claim 14, wherein the plurality of thin film transistors include a first thin film transistor being a driving transistor, and a second thin film transistor being a switching transistor.

16. The display apparatus according to claim 14, wherein the display apparatus includes an emission area and a transmission area, and the pixel driver overlaps the emission area.

17. A thin film transistor comprising:
a light shielding layer extending in a first direction on a substrate;
an active layer extending in the first direction on the light shielding layer; and
a gate electrode extending in a second direction on the active layer, the second direction being substantially perpendicular to the first direction,
wherein the gate electrode includes at least one gate electrode opening extending in the first direction, and
wherein the at least one gate electrode opening includes a first gate electrode opening and a second gate electrode opening respectively disposed on sides of the active layer.

18. The thin film transistor of claim 17, wherein a width of an area of the gate electrode in which the at least one gate electrode opening is located is greater than a width of another area of the gate electrode away from the at least one gate electrode opening.

19. A thin film transistor comprising:
a light shielding layer on a substrate;
a buffer layer on the light shielding layer;
an active layer on the buffer layer;
a gate insulating layer on the active layer; and
a gate electrode on the gate insulating layer,
wherein the gate electrode includes a first gate electrode opening disposed within the gate electrode, and
wherein the first gate electrode opening is provided in an inclined portion of the gate electrode.

20. A display apparatus comprising:
a pixel driver; and
a display element connected to the pixel driver,
wherein the pixel driver includes a plurality of transistors, each of at least one of the plurality of thin film transistors being the thin film transistor of claim 19.

* * * * *